United States Patent
Wada et al.

(10) Patent No.: US 6,452,860 B2
(45) Date of Patent: Sep. 17, 2002

(54) SEMICONDUCTOR MEMORY DEVICE HAVING SEGMENT TYPE WORD LINE STRUCTURE

(75) Inventors: Masaharu Wada, Yokohama (JP); Kenji Tsuchida, Kawasaki (JP); Tsuneo Inaba, Kamakuara (JP); Atsushi Takeuchi, Yokohama (JP); Toshimi Ikeda, Yokohama (JP); Kuninori Kawabata, Kawasaki (JP)

(73) Assignees: Kabushiki Kaisha Toshiba, Kawasaki (JP); Fujitsu Limited, Kanagawa (JP)

( * ) Notice: Subject to any disclaimer, the term of this patent is extended or adjusted under 35 U.S.C. 154(b) by 0 days.

(21) Appl. No.: 09/871,646

(22) Filed: Jun. 4, 2001

(30) Foreign Application Priority Data

Jun. 6, 2000 (JP) ......................... 2000-168995

(51) Int. Cl.⁷ ............................. G11C 8/00; G11C 5/06
(52) U.S. Cl. ...................... 365/230.06; 365/51; 365/63
(58) Field of Search ............................. 365/51, 63, 72, 365/230.06, 230.03

(56) References Cited

U.S. PATENT DOCUMENTS

| | | | |
|---|---|---|---|
| 5,751,651 A | 5/1998 | Ooishi | 365/226 |
| 5,875,148 A * | 2/1999 | Tanaka et al. | 365/189.11 |
| 5,903,022 A * | 5/1999 | Takashima et al. | 257/296 |
| 5,933,387 A | 8/1999 | Worley | 365/230.03 |
| 5,953,242 A | 9/1999 | Kitsukawa et al. | 365/51 |
| 6,031,779 A | 2/2000 | Takahashi et al. | 365/226 |
| 6,052,301 A * | 4/2000 | Ikeda et al. | 365/230.06 |
| 6,317,353 B1 * | 11/2001 | Ikeda et al. | 365/226 |

FOREIGN PATENT DOCUMENTS

| | | |
|---|---|---|
| DE | 19918932 A1 | 1/2000 |
| JP | 2000-323672 | 11/2000 |

* cited by examiner

Primary Examiner—Son Mai
(74) Attorney, Agent, or Firm—Banner & Witcoff, Ltd.

(57) ABSTRACT

A semiconductor memory device has a segment type word line structure and comprises a plurality of main word lines and a plurality of sub word lines which are arranged at different levels. The semiconductor memory device is provided with a memory cell array divided into a plurality of cell array blocks. A plurality of sub row decoder areas, each for selecting one of the sub word lines, are defined between the cell array blocks. A plurality of first metal wiring lines formed by use of the same wiring layer as the main word lines are provided. The first metal wiring lines pass across the sub row decoder areas and the cell array blocks.

16 Claims, 7 Drawing Sheets

SEMICONDUCTOR MEMORY DEVICE HAVING SEGMENT TYPE WORD LINE STRUCTURE

CROSS-REFERENCE TO RELATED APPLICATIONS

This application is based upon and claims the benefit of priority from the prior Japanese Patent Application No. 2000-168995, filed Jun. 6, 2000, the entire contents of which are incorporated herein by reference.

BACKGROUND OF THE INVENTION

The present invention relates to a semiconductor memory device having a segment type word line structure. More specifically, the invention relates to a dynamic semiconductor memory (DRAM) comprising a memory cell array that is divided into a plurality of cell array blocks. In particular, the present invention is directed to the technology for arranging wiring layers on the memory cell array.

In a conventional semiconductor memory having a multi-layered structure, multi-layered metal wiring is provided on a memory cell array. The top layer (the uppermost layer) of this metal wiring is used as data transmission lines or control signal lines (such as a column selection line). The second layer from the top is used as word lines, for example. In the case of a DRAM comprising an array of dynamic memory cells (DRAM cells) employing a stacked capacitor structure, plate electrodes of bit lines and cell capacitors are provided on the array in such a manner that the plate electrodes are located in a layer that is lower than the second metal wiring layer from the top. In a layer lower than the layer where the plate electrodes are provided, gate lines (word lines) of a DRAM cell, which are formed of polysilicon and silicide, are provided.

A segment type word line structure is known as a structure applicable to a DRAM that has a memory cell array divided into a plurality of cell array blocks. In the segment type word line structure, main word lines and sub word lines are provided at different levels. Normally, eight or four of the sub word lines are connected to one main word line.

FIG. 9 shows an example of a conventional segment type word line structure. In this example eight sub word lines are connected to one main word line, and FIG. 9 shows part of a DRAM having this structure.

Referring to FIG. 9, numeral 1 denotes cell array blocks obtained by dividing a memory cell array 19. Numeral 3 denotes a main row decoder area located at one end of the memory cell array 19. Numeral 17 denotes a main row decoder, numeral 7 denotes a main word line driver, and numeral 2 denotes a main word line driven by the main word line driver 7. Numeral 8 denotes a sub row decoder area, numeral 12 denotes a sub row decoder, and numeral 13 denotes a contact between one main word line 2 and the sub row decoder 12. Numeral 14 denotes a word line drive control signal line, and numeral 15 denotes a contact between the word line drive control signal line 14 and the sub row decoder 12. Numeral 10 denotes a sub word line driver, and numeral 11 denotes sub word lines driven by the sub word line driver 10. Numeral 16 denotes a sense amplifier area where a bit line sense amplifier is arranged. Numeral 18 denotes a section driver, by which a cell array block selection signal for selecting the sub row decoder 12 is supplied to the word line drive control signal line 14.

In this word line structure, it is preferable that the main word lines 2 be made of a metal wiring layer and the gate lines of the DRAM cell be used as the sub word lines 11. In this case, the wiring pitch of the metal wiring layer used as the main word lines 2 can be determined without severe restrictions, so that an area that can be used for another purpose can be provided. In such an area, a wiring layer portion other than the main word lines 2 can be provided by utilizing the metal wiring layer described above.

FIG. 10 shows how the same metal wiring layer (one wiring layer) is used for providing main word lines 2 and other wiring lines in the DRAM structure described above. In FIG. 10, the same reference numbers as used in FIG. 9 denote similar or corresponding structural components.

Referring to FIG. 10, the metal wiring line 9 is formed by using a metal wiring layer that is at the same level as the main word lines 2 (e.g., the second wiring layer from the top). The metal wiring line 9 is used as control signal lines other than the main word lines 2; alternatively, it is used as power supply lines.

In this structure, the uppermost metal wiring layer (not shown) is globally arranged on the memory cell array 19. The main word lines 2 are provided in common to the cell array blocks 1. In other words, the main word lines 2 extend beyond the other end portion of the memory cell array 19, i.e., beyond the end portion opposite to that where the main row decoder 17 is provided.

On the other hand, the metal wiring line 9 does not extend beyond the cell array block 1. This means that the metal wiring line 9 does not pass across the sub row decoder 12. The metal wiring line 9 is connected to the metal wiring 5 of another layer through a contact 6 in such a manner that the sub row decoder area 8 is connected to another sub row decoder area 8.

Since recent DRAMs are large in capacity, the amount of charge accumulated in the entire cell capacitor is significantly large. In accordance with this, it is strictly required that the resistance components of the power supply lines be reduced with no need to increase the chip size or the number of power supply pads.

If the power supply voltage is low, the operation of the circuits is slow, accordingly. Although some of the circuits can operate at high speed by supplying a high potential to them, this entails the use of a power supply for generating the high potential, in addition to the normal power supply. Since an increase in the number of types of power supply results in a decrease in the width of each power supply line, the wiring resistance of the power supply lines is inevitably high.

To attain a high speed of data access, the circuits have to operate at high speed, and the resistance components of control signal lines (such as the drive signal line of a bit sense amplifier) must be reduced to a minimum.

When the circuits operate at high speed, the power consumption increases, resulting in noise in the circuits. To reduce this noise, the resistance components of power supply lines must be reduced.

In the DRAM of the segment type word line structure, the wiring lines other than the main word lines 2 (such as the metal wiring line 9 used as the power supply lines or control signal lines) do not extend to the outside of their cell array block 1. Owing to this structure, it is hard to completely satisfy the requirement that the overall resistance components in signal lines and control signal lines must be reduced.

BRIEF SUMMARY OF THE INVENTION

Accordingly, the object of the present invention is to provide a semiconductor memory device wherein the overall resistance components in power supply lines and control signal lines are reduced, thus enabling a high-speed operation.

To achieve this object, the present invention provides a semiconductor memory device which has a segment type word line structure and in which a plurality of main word lines (2) and a plurality of sub word lines (11) are arranged at different levels, the semiconductor memory device comprising: a memory cell array (19) divided into a plurality of cell array blocks (1), between which a sub row decoder area (8) is arranged; and a plurality of first metal wiring lines (4, 4a, 4') formed by use of the same wiring layer as the main word lines (2), passing across the sub row decoder areas (8) and arranged in common to the cell array blocks (1).

In the semiconductor memory device of the present invention, noise on the first metal wiring lines (4, 4a) used as power supply lines should preferably be bypassed to grounding lines by use of a capacitor (31, 41) located at an end portion of the memory cell array (19).

In the semiconductor memory device of the present invention, the power supply lines and the control signal lines enable direct connection between the cell array blocks. This structure is advantageous to high-speed data access since the resistance components in the power supply lines and the control signal lines can be significantly reduced.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Embodiments of the present invention will now be described with reference to the accompanying drawings.
(First Embodiment)

Figure 1:
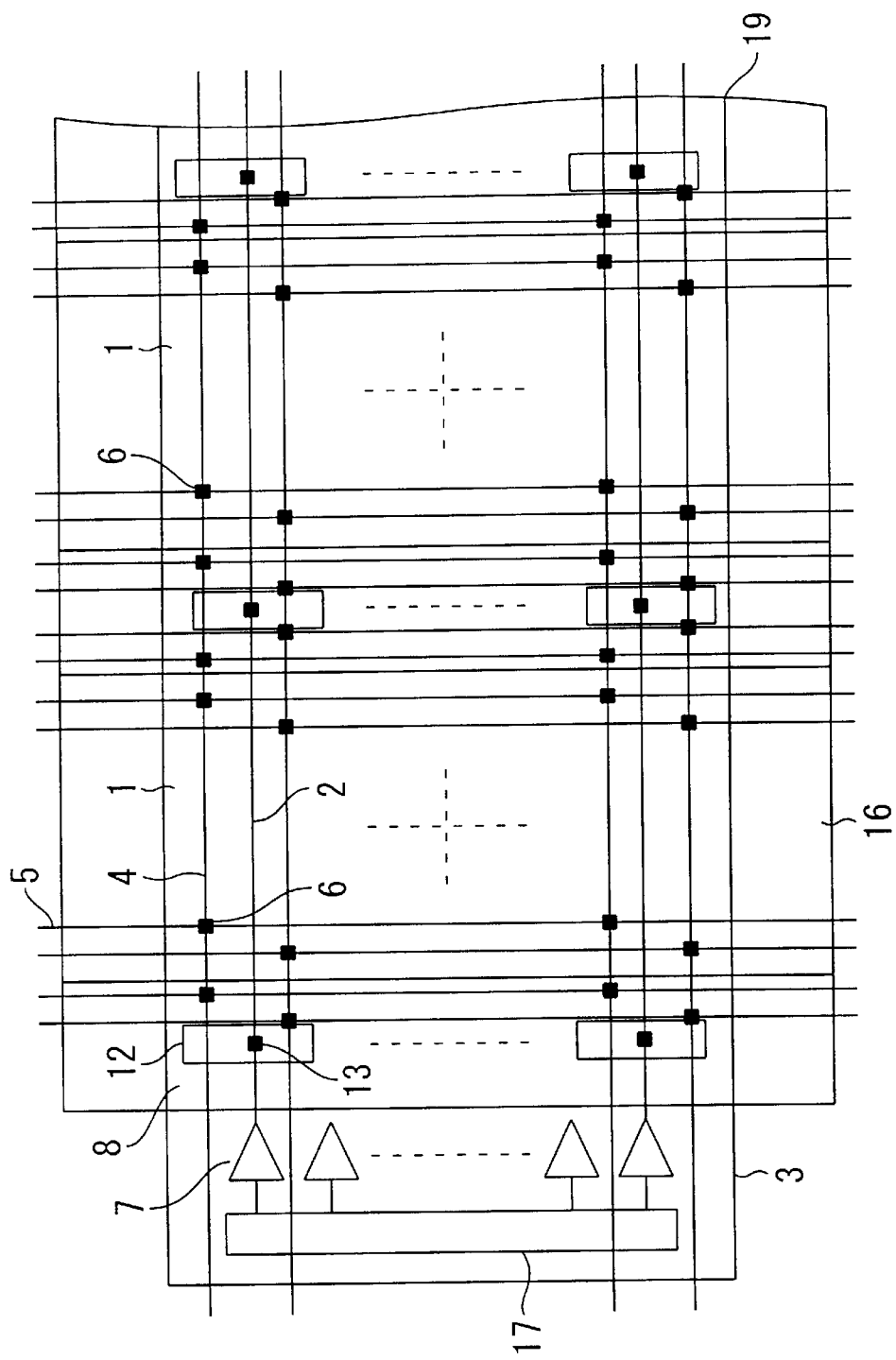
FIG. 1 shows a layout of part of a DRAM which has a segment type word line structure according to the first embodiment of the present invention.

FIG. 1 shows a layout of part of a DRAM which has a segment type word line structure according to the first embodiment of the present invention. In FIG. 1, the same reference numerals as used in FIGS. 9 and 10, which illustrate the conventional DRAM, denote similar or corresponding structural elements.

Figure 9:
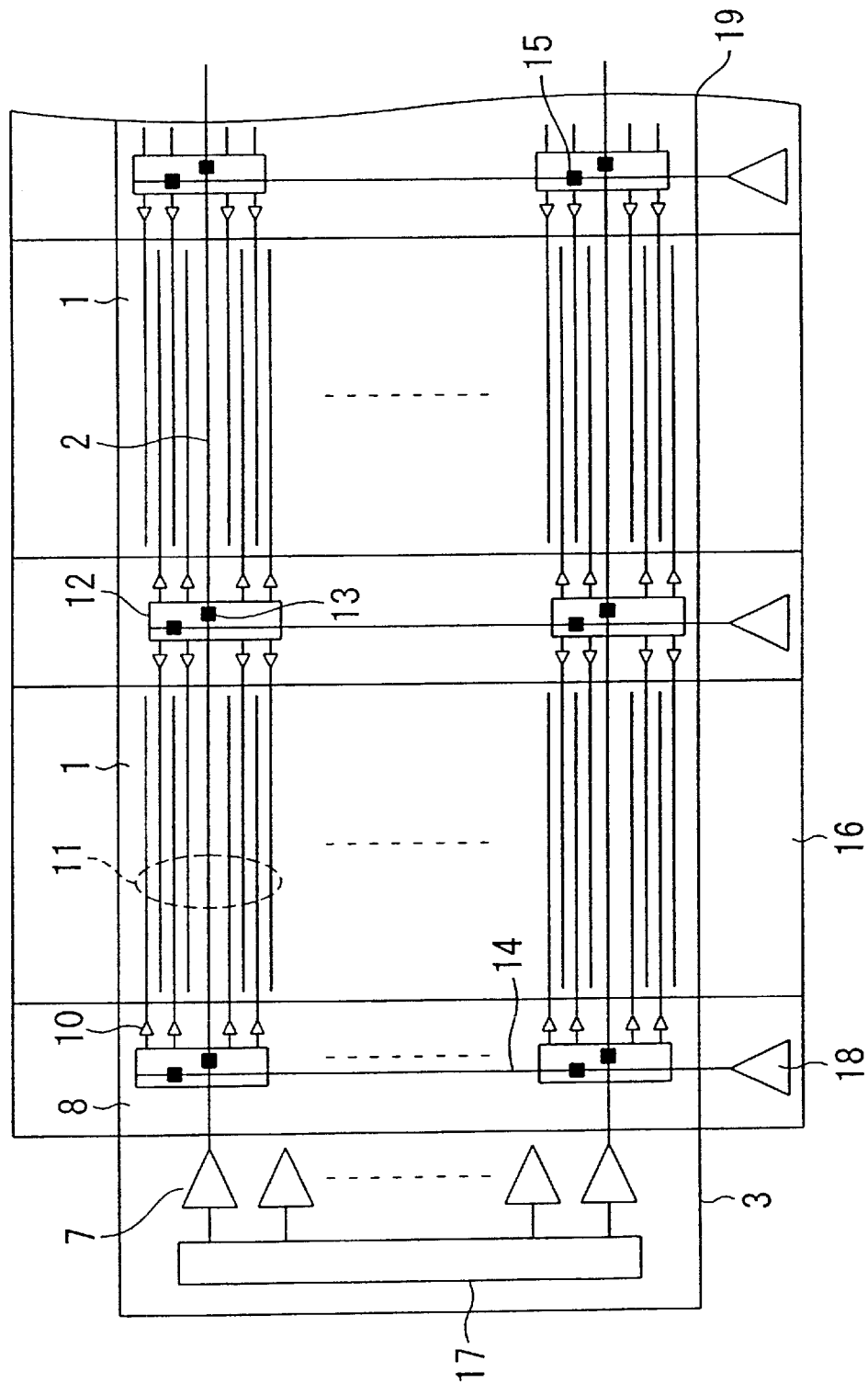
FIG. 9 shows a conventional layout of part of a DRAM which has a segment type word line structure.
Figure 10:
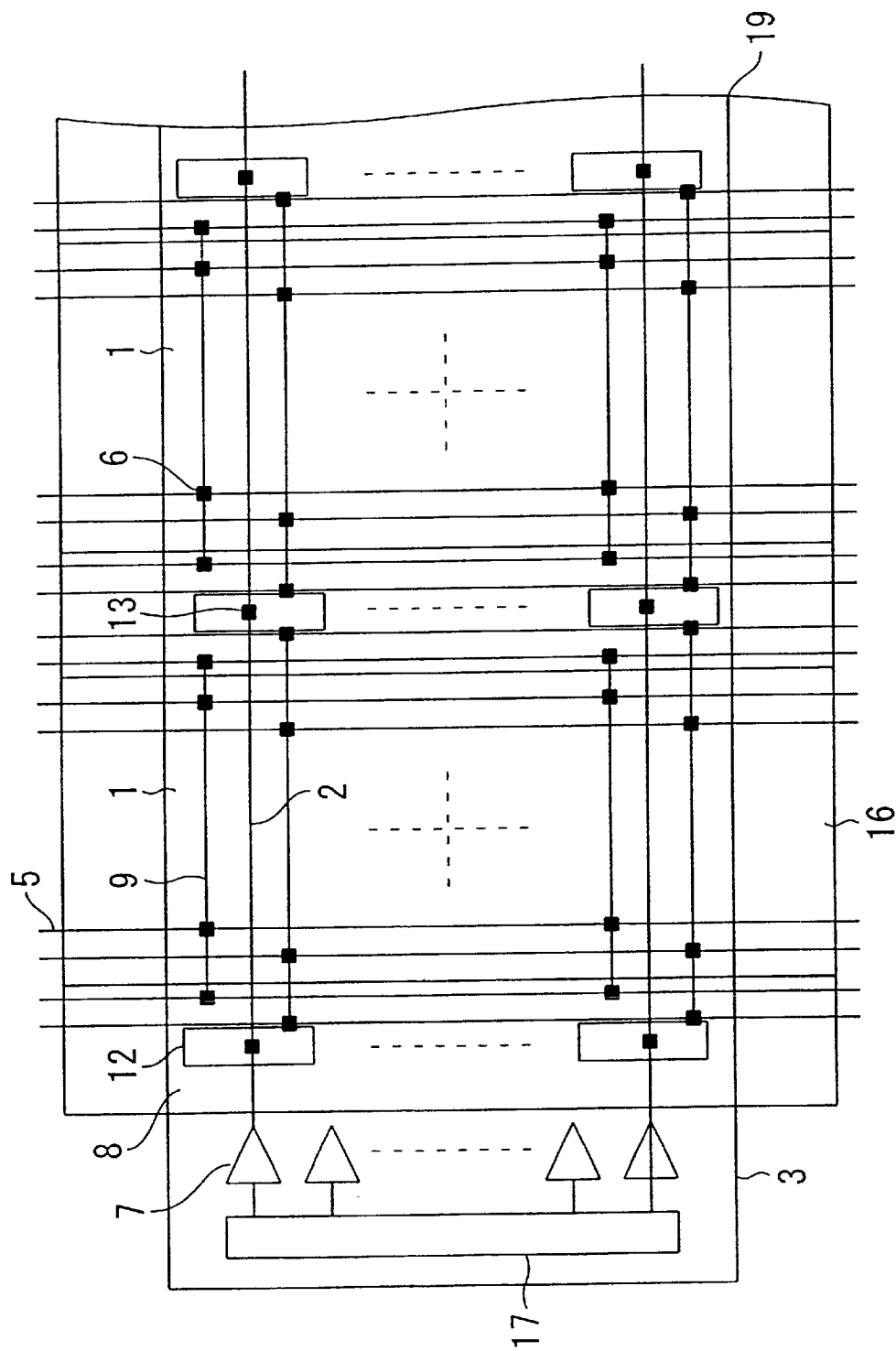
FIG. 10 shows a layout illustrating how, in the DRAM of FIG. 9, wiring lines other than the main word line are formed by use of the same metal wiring layer as the main word line.

The DRAM shown in FIG. 1 has a word line structure that is similar to that of the DRAM shown in FIG. 9. The DRAM shown in FIG. 1 differs from that shown in FIG. 10 in the arrangement of the first metal wiring lines 4, which are formed by use of the same layer as the main word lines 2 (e.g., the second layer from the top).

Referring to FIG. 1, numeral 1 denotes cell array blocks obtained by dividing a memory cell array 19. Numeral 3 denotes a main row decoder area located at one end of the memory cell array 19. Numeral 17 denotes a main row decoder provided in common to the cell array blocks 1 and used for selecting a row. Numeral 7 denotes a main word line driver selected by the main row decoder 17. Numeral 2 denotes a main word line driven by the main word line driver 7.

Numeral 8 denotes a sub row decoder area located at an end portion of each cell array block 1. Numeral 12 denotes a sub row decoder used for row selection in each cell array block 1. Numeral 13 denotes a contact between the main word line 2 and the sub row decoder 12. Numeral 16 denotes a sense amplifier area arranged at the end portion of the cell array block 1, and a bit line sense amplifier, for example, is arranged in that area.

In the same layer as the main word lines 2, a plurality of first metal wiring lines 4 are arranged. These wiring lines 4 are used as power supply lines other than the main word lines 2, and also as control signal lines. The first metal wiring lines 4 are arranged in parallel to the main word lines 2 (i.e., in the horizontal direction of the Figure) and pass across the sub row decoder 12 between the adjacent cell array blocks 1.

In the layer located above the first metal wiring lines 4, a second metal wiring line 5 is provided for controlling each cell array block 1. The second metal wiring line 5 extends in a direction perpendicular to the direction in which the main word lines 2 extend. (The direction in which the second metal wiring line 5 extends is the vertical direction of the Figure.) A plurality of contacts 6 for connecting the first metal wiring lines 4 and the second metal wiring line 5 are provided on each cell array block 1.

A design rule that enables the above arrangement is adopted. In the conventional art, the metal wiring line 9 does not extend to the outside of its cell array block 1. In the embodiment of the present invention described above, the first metal wiring lines 4 are arranged in such a manner that they pass across the sub row decoder area 12 and connect the cell array blocks 1 together. The embodiment is featured in that the first metal wiring lines 4 are used as power supply lines (which provide voltage VCC, voltage VSS, internally-reduced voltage Vint, boosted voltage Vpp, word line OFF-control negative power voltage Vnn, back gate negative voltage Vbb, etc.), or as control signal lines such as a line that provides a bit sense amplifier drive signal.

For simplicity, the number of metal wiring lines illustrated in FIG. 1 is limited to two. Although a data line (bit line) for column selection is provided in each cell array block, illustration of such a data line is omitted. Likewise, illustration of a sub word line driver, a sub word line, a word line drive control signal line, and a contact between the word line drive control signal line and the sub row decoder 12, is omitted.

Figure 2:
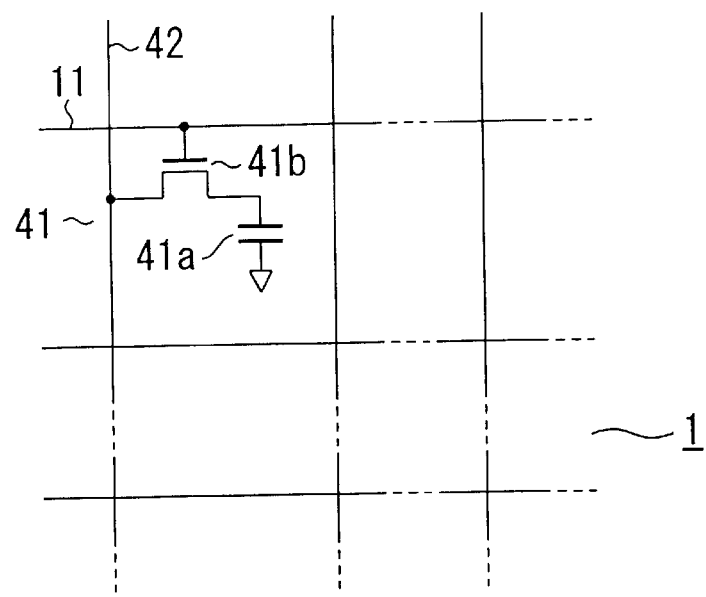
FIG. 2 is an equivalent circuit diagram of a cell array block used in the DRAM shown in FIG. 1.

FIG. 2 shows an example of the cell array block 1. In the cell array block 1, a plurality of DRAM cells 41 are arranged in a matrix pattern. Each DRAM cell 41 is located at the intersection between a bit line 42 and a sub word line 11. Each DRAM cell 41 is provided with a cell capacitor 41a for accumulating charge, and a cell transistor 41b for transferring the charge.

As described above, in the embodiment of the present invention, the metal wiring lines 4, which enable direction connection of the cell array blocks 1, can be used as power supply lines or control signal lines. To be more specific, the metal wiring lines 4 are arranged in such a manner as to pass across the sub row decoder area 8 between the adjacent cell array blocks 1. This structure enables direction connection between the cell array blocks 1. In the case where the metal wing lines 4 are used as power supply lines, the resistance components of the power supply lines can be significantly reduced. In the case where they are used as control signal lines (e.g., a sense amplifier drive signal line through which a drive signal is supplied to the bit sense amplifier of each sense amplifier area 16), the resistance of the control signal lines can be significantly reduced. In each cell array block 1, it is desirable that the sense amplifier drive signal line be arranged close to the sense amplifier 16.

As described above, when data access is executed at high speed, the operating speed of circuits is kept high and the resistance of control signal lines (e.g., a bit sense amplifier drive signal line) are significantly reduced. Hence, the noise in a circuit can be suppressed even when a large amount of current is used for the high-speed operation.

(Second Embodiment)

Figure 3:
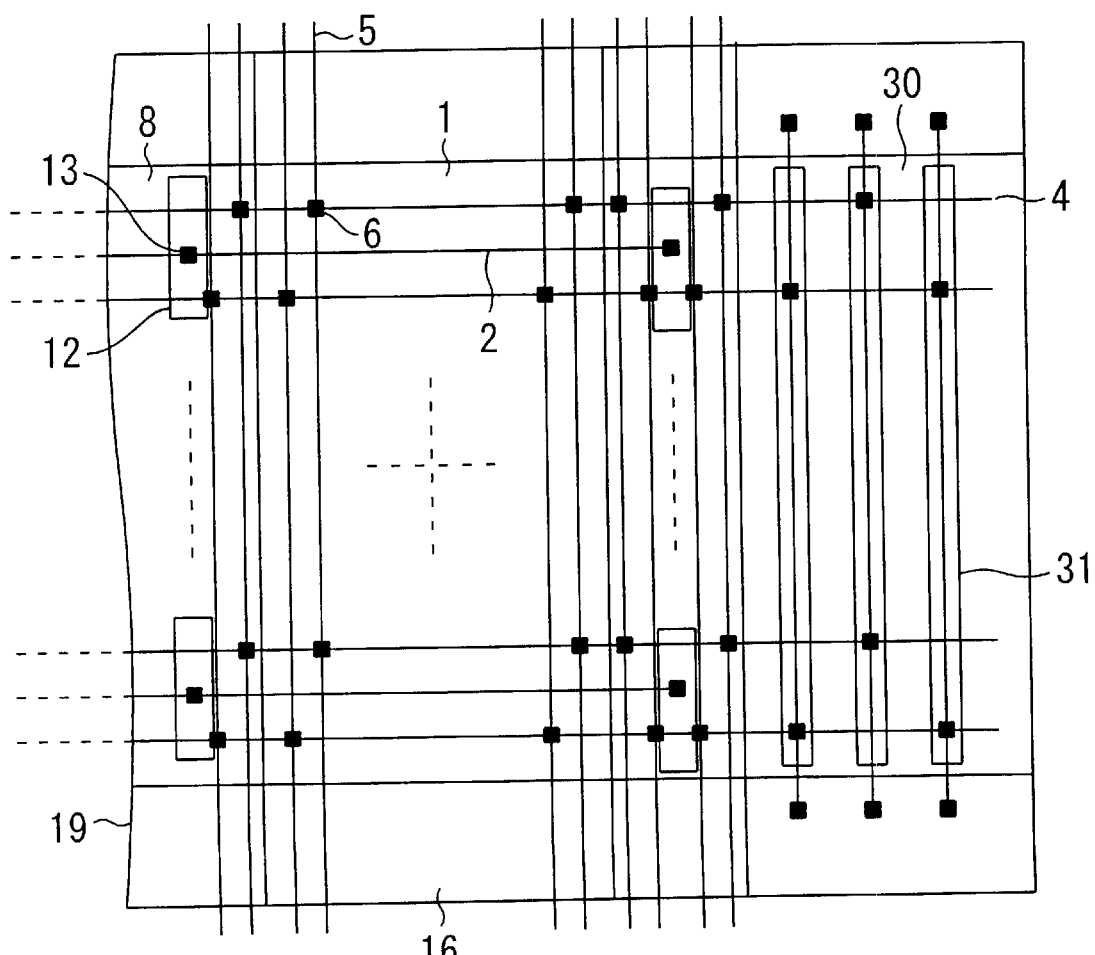
FIG. 3 shows a layout of part of a DRAM which has a segment type word line structure according to the second embodiment of the present invention.

FIG. 3 shows a pattern layout of part of a DRAM which has a segment type word line structure according to the second embodiment of the present invention. In FIG. 3, the same reference numerals as used in FIG. 1 denote similar or corresponding structural elements.

Figure 4:
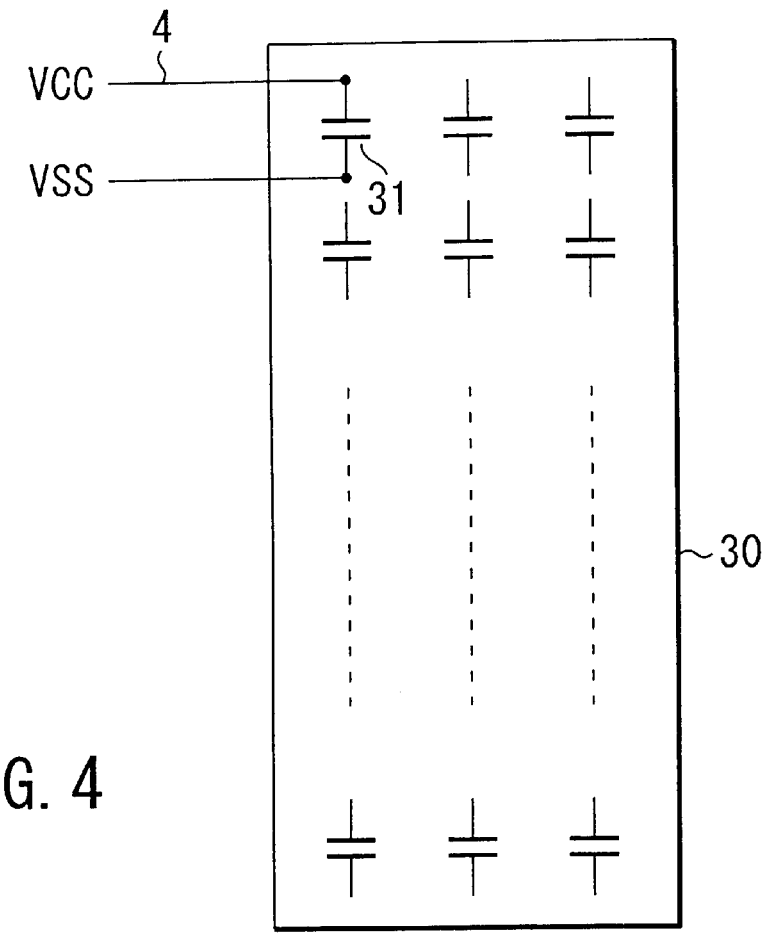
FIG. 4 is an equivalent circuit diagram of the capacitor area of the DRAM shown in FIG. 3.
Figures 5A, 5B:
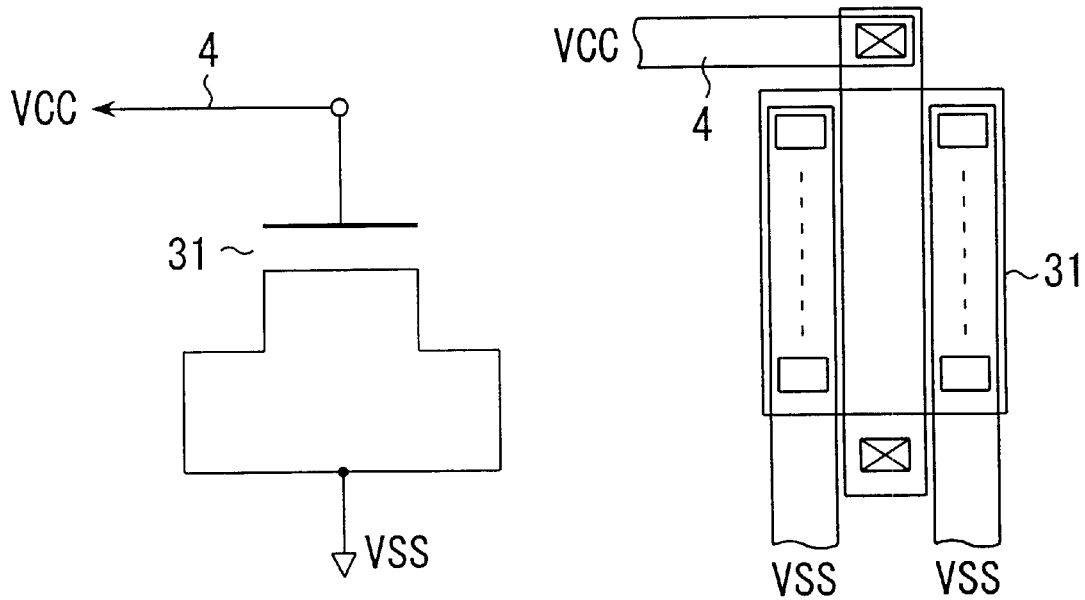
FIG. 5A is a circuit diagram of an MOS capacitor that forms the capacitor area shown in FIG. 4.
FIG. 5B shows the structure of the MOS capacitor.

The DRAM shown in FIG. 3 differs from that shown in FIG. 1 in that a capacitor area (a capacitor array) 30 is provided in the neighborhood of a memory cell array 19. To be more specific, a plurality of MOS capacitors 31 are arranged at the other end of the memory cell array 19 in such a manner as to form a capacitor area 30 (FIG. 4). (In the present embodiment, the MOS capacitors 31 are arranged in the region opposite to the region where the main row decoder area 3 is located.) As shown in FIGS. 5A and 5B, each MOS capacitor 31 is designed in such a manner that noise is bypassed between power supply lines (VCC) and grounding lines (VSS), both formed of a first metal wiring lines 4.

The configuration described above is advantageous in that a pair of electrodes of each MOS capacitor 31 can be connected to the first metal wiring lines 4 (which are used as power supply lines and grounding lines), with a low resistance maintained. Thus, the power supply noise can be reduced remarkably.

(Third Embodiment)

Figure 6:
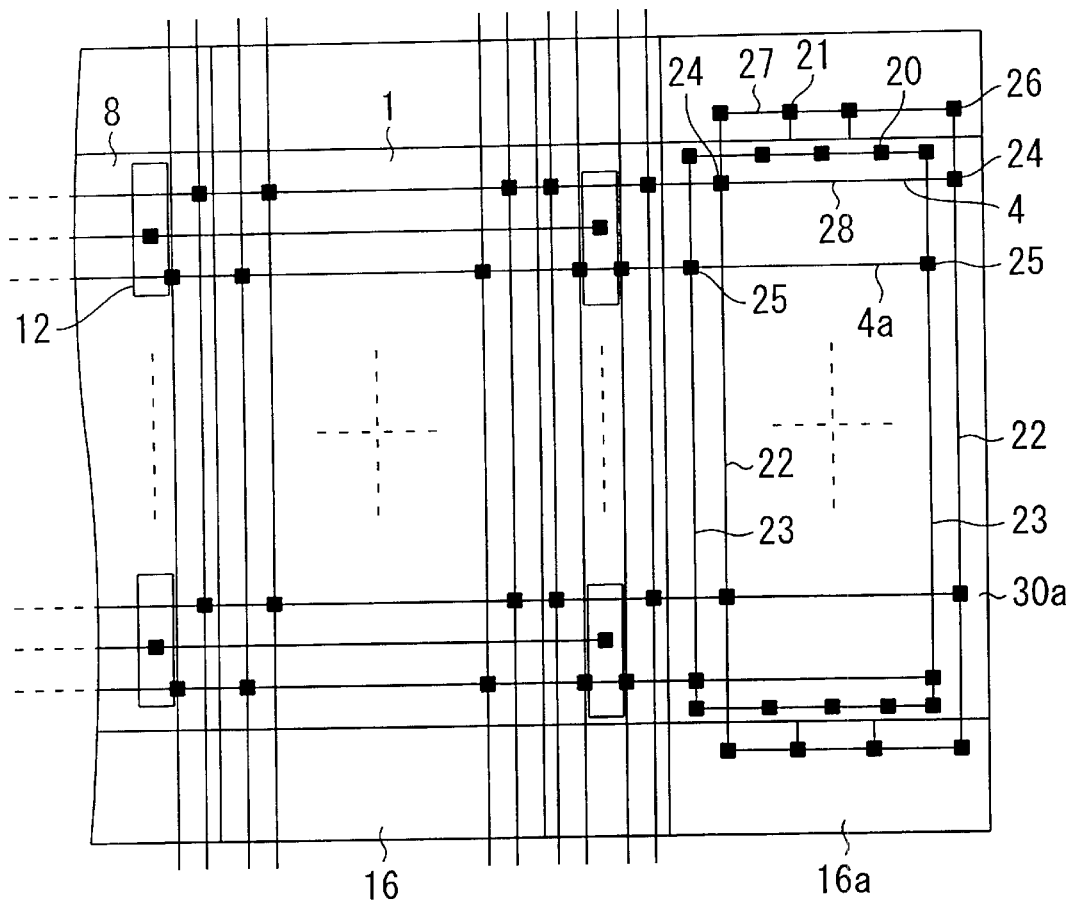
FIG. 6 shows a layout of part of a DRAM which has a segment type word line structure according to the third embodiment of the present invention.

FIG. 6 shows a pattern layout of part of a DRAM which has a segment type word line structure according to the third embodiment of the present invention. In FIG. 6, the same reference numerals as used in FIG. 3 denote similar or corresponding structural elements.

The DRAM shown in FIG. 6 is similar to that shown in FIG. 3 in that a capacitor area (capacitor array) 30a is located in the neighborhood of the memory cell array 19. However, the former is distinguished from the latter in the structure of the capacitor area 30a. That is, the capacitor area 30a of the third embodiment, which is at the other end of the memory cell array 19 (i.e., in the region opposite to the region where the main row decoder area 3 is located, in the present embodiment), is defined by a plurality of DRAM cells connected in parallel.

In the third embodiment, the capacitor area 30a is a block wherein a plurality of DRAM cells 41 are arranged in a matrix pattern (FIG. 2), as in the cell array block 1. Each DRAM cell 41 is designed in such a manner that its transistor 41b is normally ON.

Figure 7:
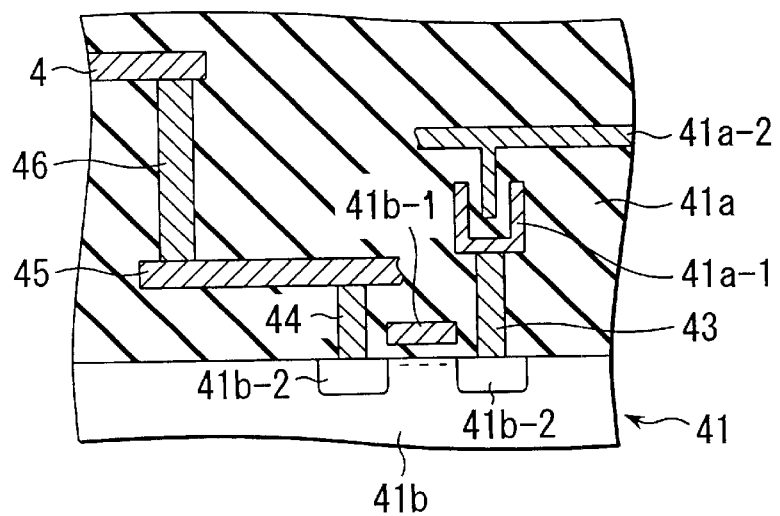
FIG. 7 is a cross section showing a DRAM cell that forms the capacitor area of the DRAM shown in FIG. 6.

The sectional structure of the DRAM cell 41 will be described with reference to FIG. 7. Referring to FIG. 7, the cell capacitor 41a comprises a capacitor electrode 41a-1 and a plate electrode 41a-2. The cell transistor 41b comprises a gate line 41b-1 and a pair of diffusion regions 41b-2. The cell capacitor 41a is connected to one of the diffusion regions 41b-2 of the cell transistor 41b. A metal wiring line 45, which is at a lower level than the first metal wiring line 4, is connected to the other diffusion region 41b-2 by way of contact 44. The first metal wiring line 4 is connected to the metal wiring line 45 by way of contact 46.

Numeral 20 in FIG. 6 denotes a node provided for the plate electrode 41a-2 of the cell capacitor 41a. The node is connected to the first metal wiring line 4a that is used for providing a grounding potential. The first metal wiring layer 4a is connected to second metal wiring lines 23 by way of contact 25. (The number of second metal wiring lines 23 illustrated in FIG. 6 is two, for the sake of simplicity.)

On the side of the capacitor electrode 41a-1 of the cell capacitor 41a, a bit line is extended to the sense amplifier area 16a. The metal wiring line 4 (node 28) that is used for providing a power supply potential is connected to node 22 by way of contact 24. Part of the first metal wiring line 4 is extended to the sense amplifier area 16a (where the plate electrode 41a-2 is not located) and thus functions as first metal wiring line 27. On the sense amplifier area 16a, the first metal wiring line 27 described above is connected to a bit line by way of contact 21. The first metal wiring layer 27 is connected to node 22 by way of contact 26.

With the above structure, the paired electrodes of each cell capacitor 41a in the capacitor area 30a can be connected to the first metal wiring lines 4, 4a, which serve as power supply lines and grounding lines, with a low resistance. Hence, the power supply noise can be remarkably suppressed, as in the case of the DRAM of the second embodiment.

When the cell transistor 41b described above is formed, it is desirable that the dose at the time of channel implantation be controlled in such a manner that the cell transistor 41b is normally in the ON state. In the case of the present invention, the capacitor area 30a is similar in structure to the cell array block 1. In such a case, an ON voltage is preferably applied to the gate line (sub word line) 11 of the cell transistor 41b. As can be seen from this, where the capacitor area 30a similar in structure to the cell array block 1 is provided, the same advantages as described above in relation to the second embodiment are attained. In addition, the DRAM cells 41 can be arranged in a cyclic pattern. This enables easy design of masks and is advantageous in determining the manufacturing process.

(Fourth Embodiment)

Figure 8:
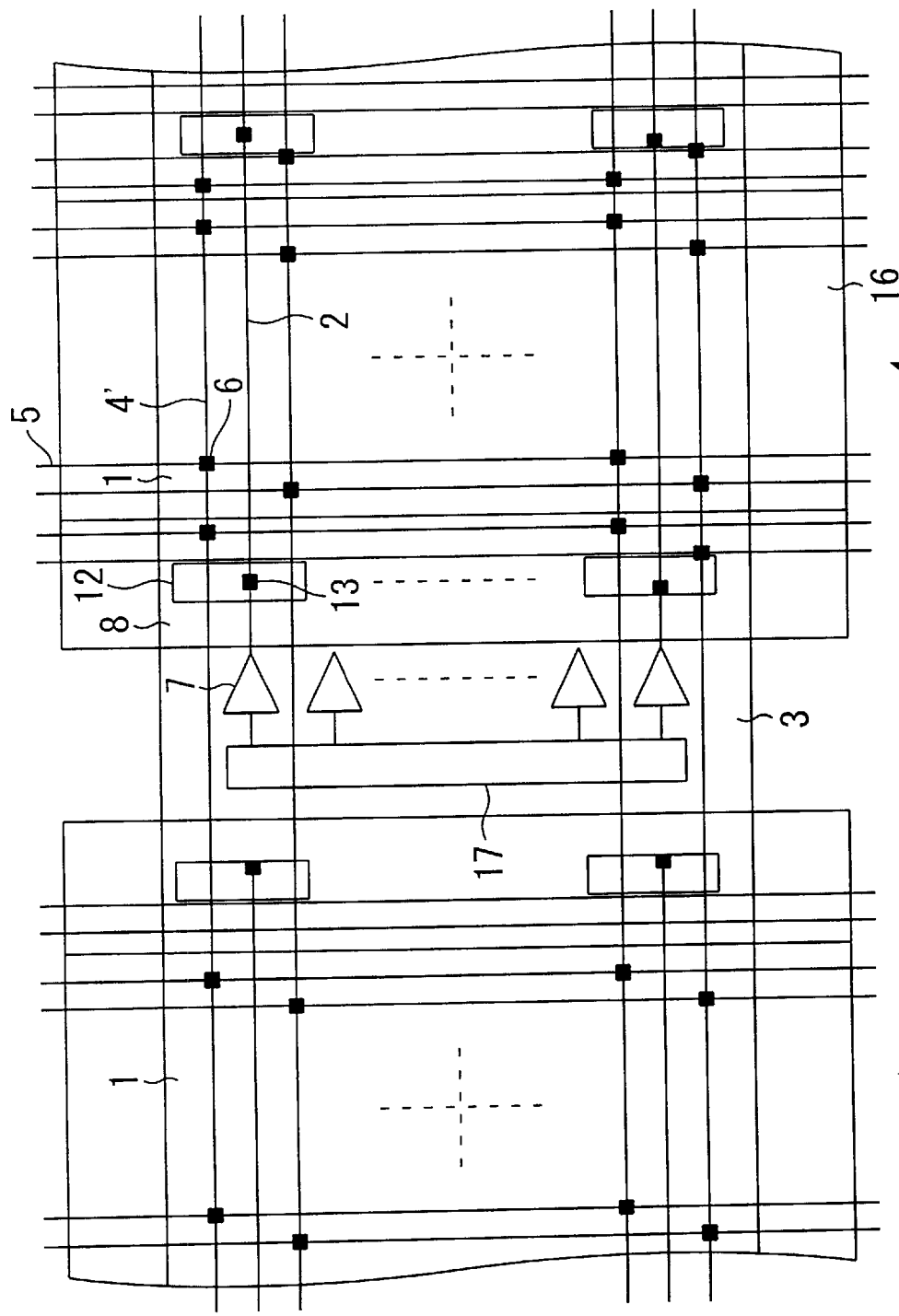
FIG. 8 shows a layout of part of a DRAM which has a segment type word line structure according to the fourth embodiment of the present invention.

FIG. 8 shows a layout of part of a DRAM which has a segment type word line structure according to the fourth embodiment of the present invention. In FIG. 8, the same reference numbers as used in FIG. 1 denote the similar or corresponding structural components.

The DRAM shown in FIG. 8 has a word line structure similar to that of the DRAM shown in FIG. 1. The DRAM in FIG. 8 has a multi-bank structure wherein a plurality of memory banks BK are provided, and each of these memory banks BK comprises a plurality of cell array blocks 1, such as those described above. The DRAM of the fourth embodiment differs from that of the first embodiment in the arrangement of the first metal wiring lines 4' that are other than the main word lines 2. To be more specific, the first metal wiring lines 4' other than the main word lines 2 pass across the main row decoder area 3 located between the memory banks BK, in such a manner that the first metal wiring lines 4' are on a plurality of memory banks BK.

The above structure attains the same advantages as were explained above in relation to the first embodiment. In addition, the wiring resistance between the memory banks BK is low. Inside a chip, therefore, global wiring connection is attained in a low-resistance state.

The structure of the fourth embodiment is applicable to the DRAMs of the second and third embodiments.

As detailed above, the present invention can provide a semiconductor memory device which has a segment type word line structure and in which the overall resistance components in power supply lines and control signal lines are reduced. When data access is executed at high speed, the operating speed of circuits is kept high and the resistance components of control signal lines (e.g., a bit sense amplifier drive signal line) are significantly reduced. Hence, the noise in a circuit can be suppressed even when a large amount of current is used for a high-speed operation.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor memory device which has a segment type word line structure and in which a plurality of main word lines and a plurality of sub word lines are arranged, the semiconductor memory device comprising:

a memory cell array divided into a plurality of cell array blocks, between which sub row decoder areas are arranged; and a plurality of first metal wiring lines formed by use of the same wiring layer as the main word lines, passing across the sub row decoder areas and arranged in common to the pluralit of cell array blocks.

2. A semiconductor memory device according to claim 1, wherein said plurality of first metal wiring lines are parallel to said main word lines.

3. A semiconductor memory device according to claim 1, wherein each of the plurality of cell array blocks includes a plurality of memory cells arranged in a matrix pattern.

4. A semiconductor memory device according to claim 1, wherein each of the sub row decoder areas is provided with a plurality of sub row decoders for selecting a specific sub word line from said plurality of sub word lines.

5. A semiconductor memory device according to claim 1, further comprising a plurality of second metal wiring lines which are located at a level above said plurality of main word lines, said plurality of second metal wiring lines extending in a direction orthogonal to said plurality of main word lines.

6. A semiconductor memory device according to claim 5, wherein said plurality of second metal wiring lines are connected to said plurality of first metal wiring lines by way of a plurality of contacts.

7. A semiconductor memory device according to claim 1, further comprising a capacitor array provided with a plurality of capacitors.

8. A semiconductor memory device according to claim 7, wherein each of said plurality of capacitors is connected to wiring lines which are included among said first metal wiring lines and which are used as a power supply line and a grounding line.

9. A semiconductor memory device according to claim 8, wherein each of said capacitors serves to bypass noise between the power supply line and the grounding line.

10. A semiconductor memory device according to claim 7, wherein each of said plurality of capacitors is an MOS capacitor.

11. A semiconductor memory device according to claim 7, wherein said capacitor array includes blocks which are similar in configuration to said plurality of cell array blocks.

12. A semiconductor memory device according to claim 11, wherein each of the memory cell array blocks includes a plurality of memory cells arranged in a matrix pattern and wherein said plurality of capacitors are memory cells which are similar in structure to said plurality of memory cells.

13. A semiconductor memory device according to claim 12, wherein said plurality of capacitors are dynamic memory cells each including a cell capacitor and a cell transistor, and said cell transistor is in a normally-ON state.

14. A semiconductor memory device according to claim 1, wherein said plurality of cell array blocks constitute a plurality of memory banks, and said plurality of first metal wiring lines are provided in common to said plurality of memory banks.

15. A semiconductor memory device according to claim 14, wherein said plurality of memory banks are spaced apart by main row decoder areas, and said first metal wiring lines extend across the main row decoder areas.

16. A semiconductor memory device according to claim 15, wherein each of said main row decoder areas is provided with a plurality of main row decoders, each of the main row decoders selecting a specific main word line from said plurality of main word lines.

* * * * *

UNITED STATES PATENT AND TRADEMARK OFFICE
CERTIFICATE OF CORRECTION

PATENT NO.    : 6,452,860 B2
DATED         : September 17, 2002
INVENTOR(S)   : Masaharu Wada et al.

It is certified that error appears in the above-identified patent and that said Letters Patent is hereby corrected as shown below:

Column 7,
Line 46, "pluralit" has been replaced with -- plurality --.

Signed and Sealed this

Eleventh Day of March, 2003

JAMES E. ROGAN
*Director of the United States Patent and Trademark Office*